United States Patent
Huang et al.

(10) Patent No.: US 11,969,677 B2
(45) Date of Patent: Apr. 30, 2024

(54) METHOD OF USING LIQUID SUPPLY SYSTEM WITH IMPROVED BUBBLE VENTING CAPACITY

(71) Applicant: TAIWAN SEMICONDUCTOR MANUFACTURING COMPANY, LTD., Hsinchu (TW)

(72) Inventors: Y. L. Huang, Hsinchu (TW); Chin-Kun Fang, Hsinchu (TW); Li-Jen Wu, Hsinchu (TW); Yu Kai Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/690,976

(22) Filed: Mar. 9, 2022

(65) Prior Publication Data
US 2022/0193580 A1 Jun. 23, 2022

Related U.S. Application Data

(62) Division of application No. 16/522,046, filed on Jul. 25, 2019, now Pat. No. 11,273,396.
(Continued)

(51) Int. Cl.
*B01D 35/02* (2006.01)
*B01D 19/00* (2006.01)
(Continued)

(52) U.S. Cl.
CPC ......... *B01D 35/02* (2013.01); *B01D 19/0031* (2013.01); *B01D 19/02* (2013.01);
(Continued)

(58) Field of Classification Search
None
See application file for complete search history.

(56) References Cited

U.S. PATENT DOCUMENTS

| 2,401,079 A | 5/1946 | Jones et al. |
| 3,163,508 A | 12/1964 | Tuck et al. |

(Continued)

FOREIGN PATENT DOCUMENTS

| CN | 1766734 | 5/2006 |
| CN | 202289573 | 7/2012 |

(Continued)

OTHER PUBLICATIONS

Office Action dated Oct. 21, 2020 for corresponding case No. TW 10-921010150. (pp. 1-5).

(Continued)

*Primary Examiner* — Christopher P Jones
*Assistant Examiner* — Phillip Y Shao
(74) *Attorney, Agent, or Firm* — Hauptman Ham, LLP

(57) ABSTRACT

A method for eliminating bubbles from a liquid dispensing system includes flowing a liquid containing bubbles into a liquid inlet of a tank from a filter to substantially fill the tank, wherein substantially all bubbles accumulate in an upper portion of the tank having a lateral dimension greater than a lateral dimension of a lower portion of the tank, and flowing the liquid into the tank comprises flowing the liquid through an inlet pipe extending at an acute angle relative to a horizontally-oriented axis of the tank. The method further includes flowing a liquid substantially free of bubbles out of the tank via a liquid outlet at the lower portion of the tank for dispensing to a substrate.

20 Claims, 5 Drawing Sheets

Related U.S. Application Data

(60) Provisional application No. 62/725,519, filed on Aug. 31, 2018.

(51) Int. Cl.
    *B01D 19/02*     (2006.01)
    *H01L 21/67*     (2006.01)

(52) U.S. Cl.
    CPC .... *H01L 21/67017* (2013.01); *H01L 21/6715* (2013.01); *B01D 19/0042* (2013.01); *B01D 19/0063* (2013.01)

(56) References Cited

U.S. PATENT DOCUMENTS

| | | | |
|---|---|---|---|
| 5,527,161 A | 6/1996 | Bailey et al. | |
| 7,811,364 B2 | 10/2010 | Saito | |
| 7,871,461 B2 | 1/2011 | Saito | |
| 2008/0206671 A1 | 8/2008 | Thackeray et al. | |
| 2014/0034584 A1 | 2/2014 | Marumoto et al. | |
| 2014/0260963 A1 | 9/2014 | Wang | |
| 2015/0000517 A1 | 1/2015 | Yoshihara et al. | |
| 2015/0092167 A1 | 4/2015 | Terashita et al. | |

FOREIGN PATENT DOCUMENTS

| | | |
|---|---|---|
| CN | 102926844 | 2/2013 |
| CN | 104517874 | 4/2015 |
| TW | 478945 | 3/2002 |
| TW | 201509543 | 3/2015 |

OTHER PUBLICATIONS

Office Action dated Apr. 25, 2021 for corresponding case No. CN 201910803381.X (pp. 1-10).

METHOD OF USING LIQUID SUPPLY SYSTEM WITH IMPROVED BUBBLE VENTING CAPACITY

RELATED APPLICATIONS

This application is a divisional application of U.S. application Ser. No. 16/522,046, filed Jul. 25, 2019, which claims priority to provisional U.S. Application No. 62/725,519, filed Aug. 31, 2018, which are incorporated herein by reference in their entireties.

BACKGROUND

Semiconductor manufacturing uses various types of liquid for processing semiconductor wafers to form integrated circuits (ICs) thereon. A liquid for wafer processing is delivered from a supply vessel to wafer processing equipment via a liquid dispensing system.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
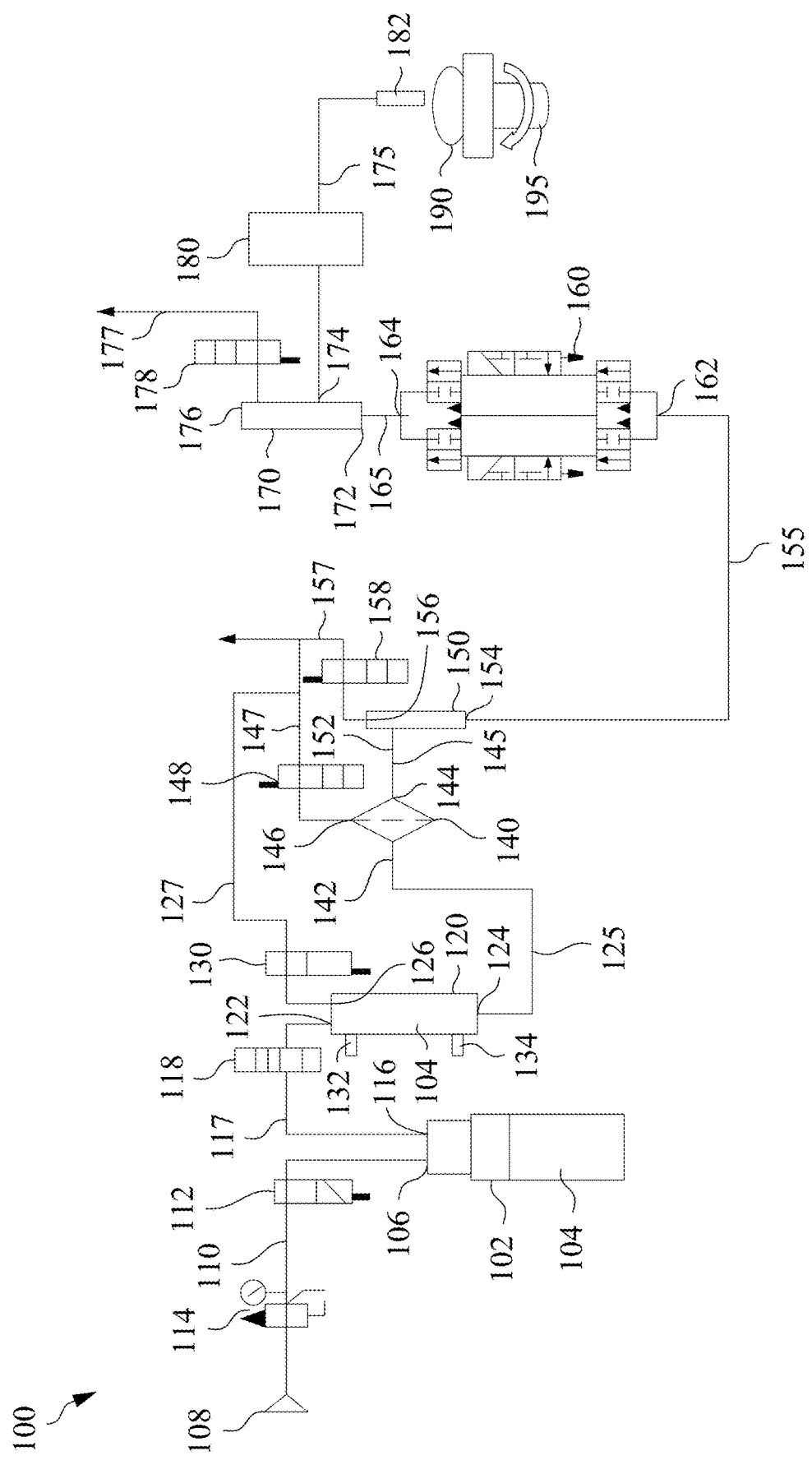
FIG. 1 is a schematic diagram of a liquid dispensing system, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

During semiconductor fabrication, a variety of lithography processes are performed to form devices on a semiconductor wafer. A photoresist is applied to the wafer, and patterned using a photomask to form a pattern for one or more subsequent etching processes. The cost of photoresist is a significant material cost in semiconductor fabrication.

Bubbles generated during the photoresist dispensing process impact the yield of the manufacturing process. For example, the presence of bubbles in a photoresist solution deposited on the wafer causes problems, such as undesirable thickness variation, pin-holes, and high particle counts. Bubbles can appear within the liquid dispensing system for various reasons. For example, a liquid dispensing system often includes a filter for capturing bubbles and/or particle contaminants in the photoresist solution. After an extended period, the particle contaminants and/or bubbles trapped on the filter tend to block the high viscosity photoresist when the photoresist solution is passing through the filter, creating a pressure difference in the liquid dispensing system. This pressure difference generates bubbles in the filtered photoresist. As a result, a mini-tank that receives the filtered photoresist from the filter is vented more often to remove bubbles. However, the high venting frequency results in a significant amount of photoresist being wasted because every time the mini-tank is vented an amount of usable photoresist is also vented out to the drainage. As the cost of photoresist increases as exposure wavelength decreases, less waste helps to improve profitability. In addition, as the frequency of the venting operation increases, the time needed to reload the dispensing pump also increases. The production efficiency is thus reduced.

In some embodiments, a mini-tank with improved bubble venting capacity is provided between a filter and a dispensing pump of a liquid dispensing system. The mini-tank helps to reduce bubble venting frequency and at the same time, helps to improve production efficiency.

FIG. 1 is a schematic diagram of a liquid dispensing system 100, in accordance with some embodiments. The liquid dispensing system 100 is configured to dispense a liquid for a semiconductor fabrication process from a storage container 102 onto a semiconductor wafer 190. Examples of semiconductor fabrication processes include, but are not limited to, lithography, film deposition, etching, stripping, cleaning, and planarization. In some embodiments, the liquid dispensing system 100 includes a storage container 102, a buffer tank 120, a filter 140, a mini-tank 150, a dispensing pump 160, a trap 170, and a discharge nozzle 182.

The storage container 102 contains a liquid 104 to be dispensed to a semiconductor wafer 190. In some embodiments, the liquid 104 is a chemical solution used in a photolithography process. In some embodiments, the liquid 104 is a photoresist solution. In some embodiments, the liquid 104 is a developer solution used for developing a photoresist. The storage container 102 includes a gas inlet 106 at an upper portion of the storage container 102 for receiving a pressurized gas from a pressurized gas supply 108. Examples of pressurized gas include, but are not limited to, inert gases, such as nitrogen, helium or the like. The storage container 102 further includes a liquid outlet 116 at an upper portion of the storage container 102. The liquid outlet 116 is coupled to the buffer tank 120 via a pipe 117 for supplying an amount of the liquid 104 from the storage container 102 to the buffer tank 120. A valve 118 is coupled to the pipe 117 to control the flow of the liquid 104 from the storage container 102 to the buffer tank 120.

The pressurized gas supply 108 is connected to the gas inlet 106 of the storage container 102 via a pipe 110. A valve 112 is coupled to the pipe 110 for controlling the flow of the pressurized gas in the pipe 110. A sensor 114 is coupled to the pipe 110 to monitor the pressure of the pressurized gas flowing through the pipe 110 and is operated to generate a signal when the pressure of the pressurized gas is not sufficient to move the liquid from the storage container 102 to the buffer tank 120. The signal is usable as an alarm to alert an operator, or an automatic controller, e.g., a control unit 400 (FIG. 4) that the pressurized gas supply 108 is empty or has otherwise malfunctioned. The pressurized gas provided by the pressurized gas supply 108 forces the liquid flow out of the storage container 102 and into the buffer tank 120 through the pipe 117. A valve 118 is coupled to the pipe 117 for controlling the flow of the liquid 104 from the storage container 102 to the buffer tank 120. The valve 118 is normally closed and is opened in response to a control signal from the control unit 400 requesting the refill of the buffer tank 120. However, using pressurized gas increases the risk of forming bubbles in the liquid 104, and the bubbles negatively impact the production process. Therefore, bubbles are removed, or at least reduced, before the liquid 104 is dispensed by the dispensing pump 160.

The buffer tank 120 is downstream from the storage container 102 and is adapted to regulate the flow of the liquid 104 from the storage container 102 and maintain the liquid 104 at a desired level. The buffer tank 120 includes a liquid inlet 122, a liquid outlet 124, and a gas outlet 126. The liquid inlet 122 and the gas outlet 126 are arranged in an upper portion of the buffer tank 120, whereas the liquid outlet 124 is arranged in a lower portion of the buffer tank 120. Such a configuration allows the liquid 104 to enter the buffer tank 120 near the top of the buffer tank 120 and be drawn from the bottom of the buffer tank 120 to be fed to the filter 140. The bubbles in the buffer tank 120 remain at the top for easy removal from the buffer tank 120. In some embodiments, liquid inlet 122 and liquid outlet 124 are arranged in differing portions of the buffer tank 120. The liquid inlet 122 is coupled to the storage container 102 via the pipe 117 for receiving an amount of the liquid 104 from the storage container 102. The liquid outlet 124 is coupled to the filter 140 via a pipe 125 for supplying an amount of the liquid 104 from the buffer tank 120 to the filter 140. The gas outlet 126 is coupled to a pipe 127 for venting bubbles stagnating in the upper portion of the buffer tank 120 to an atmosphere outside of the buffer tank 120. A vent valve 130 is coupled to the pipe 127 for controlling the venting of the bubbles from the buffer tank 120 to the atmosphere. The vent valve 130 is normally closed and the bubbles are vented periodically from the buffer tank 120 by opening and closing the vent valve 130.

The buffer tank 120 is equipped with a plurality of sensors for maintaining the liquid 104 at a suitable level. In some embodiments, the level of the liquid 104 is kept between a high level sensor 132 and a low level sensor 134. The high level sensor 132 is configured to sense a maximum allowable liquid level in the buffer tank 120. The low level sensor 134 is configured to sense a minimum allowable liquid level in buffer tank 120. When a liquid level of the liquid 104 in the buffer tank 120 is sufficiently low so as to trigger the low level sensor 134, the low level sensor 134 generates a signal indicative of the low liquid level in the buffer tank 120. In response to the signal from the low level sensor 134, the control unit 400 sends a control signal to cause the valves 112 and 118 to open so that supply of the liquid 104 from the storage container 102 to the buffer tank 120 is started to refill the buffer tank 120. On the other hand, when a liquid level of the liquid 104 is raised up to a level to trigger the high level sensor 132, the high level sensor 132 generates a signal indicative of the high liquid level in the buffer tank 120. In response to the signal from the high level sensor 132, the control unit 400 sends a control signal to cause the valves 112 and 118 to close so that the supply of the liquid 104 from the storage container 102 to the buffer tank 120 is stopped.

The filter 140 is downstream from the buffer tank 120 and is adapted to filter the liquid discharged from the buffer tank 120 to remove contaminants such as foreign substances or coagulation materials and/or bubbles from the liquid 104 before the liquid 104 is drawn to the dispensing pump 160. In some embodiments, the filter 140 is formed from a porous media such as, for example, a mesh or a membrane. The filter 140 includes a liquid inlet 142, a liquid outlet 144, and a gas outlet 146. The liquid inlet 142 is coupled to the buffer tank 120 via the pipe 125 for receiving the liquid 104 from the buffer tank 120. The liquid outlet 144 is coupled to the mini-tank 150 via a pipe 145 for supplying the filtered liquid from the filter 140 to the mini-tank 150. The gas outlet 146 is coupled to a pipe 147 for exhausting bubbles stagnating in an upper portion of the filter 140 to the atmosphere outside of the filter 140. A vent valve 148 is coupled to the pipe 147 to control the venting of the bubbles from the filter 140 into the atmosphere. The vent valve 148 is normally closed and the bubbles are vented periodically from the filter 140 by opening and closing the vent valve 148.

After being used for a period of time and as an amount of contaminants collected by the filter 140 increases, the contaminants of the filter tend to block the liquid as the liquid passes through, causing the pressure in the filter 140 to increase. This pressure increase results in an increase in the amount of bubbles in the filtered liquid. The bubbles formed in the filtered liquid need to be eliminated, or at least reduced, by the mini-tank 150 before the filtered liquid is dispensed by the dispensing pump 160.

The mini-tank 150 is downstream from the filter 140. The mini-tank 150 receives the filtered liquid from the filter 140 and is adapted to prevent bubbles from stagnating in the filtered liquid before the filtered liquid is dispensed by the dispensing pump 160. The mini-tank 150 includes a liquid inlet 152, a liquid outlet 154, and a gas outlet 156. In some embodiments, the liquid inlet 152 is disposed at a sidewall of the mini-tank 150, the liquid outlet 154 is disposed at the bottom of the mini-tank 150, and the gas outlet 156 is disposed at the top of the mini-tank 150. The liquid inlet 152 is coupled to the filter 140 via the pipe 145 for receiving the filtered liquid from the filter 140. The liquid outlet 154 is coupled to the dispensing pump 160 via a pipe 155 for supplying the filtered liquid from the mini-tank 150 to the dispensing pump 160. The gas outlet 156 is coupled to a pipe 157 for venting bubbles accumulated in the upper portion of the mini-tank 150 to the atmosphere outside of the mini-tank 150. A vent valve 158 is coupled to the pipe 157 to control the venting of the bubbles from the mini-tank 150. The vent valve 158 is normally closed and the bubbles are vented periodically from the mini-tank 150 by opening and closing the vent valve 158. In normal operation, the filtered liquid 104 enters the mini-tank 150 near the top of the mini-tank 150 via the pipe 145 and the liquid inlet 152 and is drawn from the bottom of the mini-tank 150 to be fed to the dispensing pump 160 via the liquid outlet 154 and the pipe 155. Due to the specific gravity difference, the bubbles tend to accumulate at the top of the mini-tank 150 while the liquid tends to accumulate at the bottom of the mini-tank 150. Thus, the bubbles accumulated at the top of the mini-tank 150 are able to be substantially removed by venting through the gas outlet 156 and the pipe 157.

The mini-tank 150 and pipes 145 and 157 are designed to improve bubble venting capacity of the mini-tank 150. As a result, the bubbles in the filtered liquid are able to be substantially removed before being fed to the dispensing pump 160, which in turn helps to reduce defect formation on the semiconductor wafer 190. The improved venting capacity of the mini-tank 150 also helps to reduce the frequency of venting operation required to remove the bubbles in the mini-tank 150. As a result, an excessive waste of usable liquid in other approaches due to the frequent venting is avoided, and the time needed for reloading of the dispensing pump 160 is also reduced.

The dispensing pump 160 is downstream of the mini-tank 150 and is configured to pump the liquid 104 from the buffer tank 120, through the filter 140 and the mini-tank 150, and to the discharge nozzle 182 for deposition onto the semiconductor wafer 190. In some embodiments, the dispensing pump 160 is a gas-pressure-driven pump. In some embodiments, the dispensing pump 160 includes a liquid inlet 162 and a liquid outlet 164. The liquid inlet 162 is coupled to the mini-tank 150 via the pipe 155 for receiving the filtered liquid from the mini-tank 150. The liquid outlet 164 is coupled to the trap 170 via a pipe 165 for supplying the filtered liquid to the trap 170.

The trap 170 is downstream of the dispensing pump 160 and is configured to remove the bubbles in the filtered liquid before the filtered liquid is fed to the discharge nozzle 182. In some embodiments, the trap 170 includes a liquid inlet 172, a liquid outlet 174, and a gas outlet 176. The liquid inlet 172 is coupled to the dispensing pump 160 via the pipe 165 for receiving the filtered liquid discharged from the dispensing pump 160. The liquid outlet 174 is coupled to the discharge nozzle 182 via a pipe 175 for supplying the filtered liquid to the discharge nozzle 182. A supply control valve 180 is coupled to the pipe 175 and is configured to control the flow of the filtered liquid discharged from dispensing pump 160 to the discharge nozzle 182. The gas outlet 176 is coupled to a pipe 177 for exhausting the bubbles accumulated in an upper portion of the trap 170 to the atmosphere outside of the trap 170. A vent valve 178 is coupled to the pipe 177 and is configured to control the venting of the bubbles from the trap 170. The vent valve 178 is normally closed and the bubbles are vented periodically from the trap 170 by opening and closing the vent valve 178.

The discharge nozzle 182 is adapted to dispense, e.g., spray, the filtered liquid onto a surface of the semiconductor wafer 190. In some embodiments, the discharge nozzle 182 dispenses the filtered liquid while the semiconductor wafer 190 is rotated.

In some embodiments, the liquid dispensing system 100 is controlled by the control unit 400 that is configured to control the dispensing pump 160 and valves 112, 118, 130, 148, 158, 178 and 180, responsive to data and/or signals from one or more of sensors 132 and 134.

Figure 2:
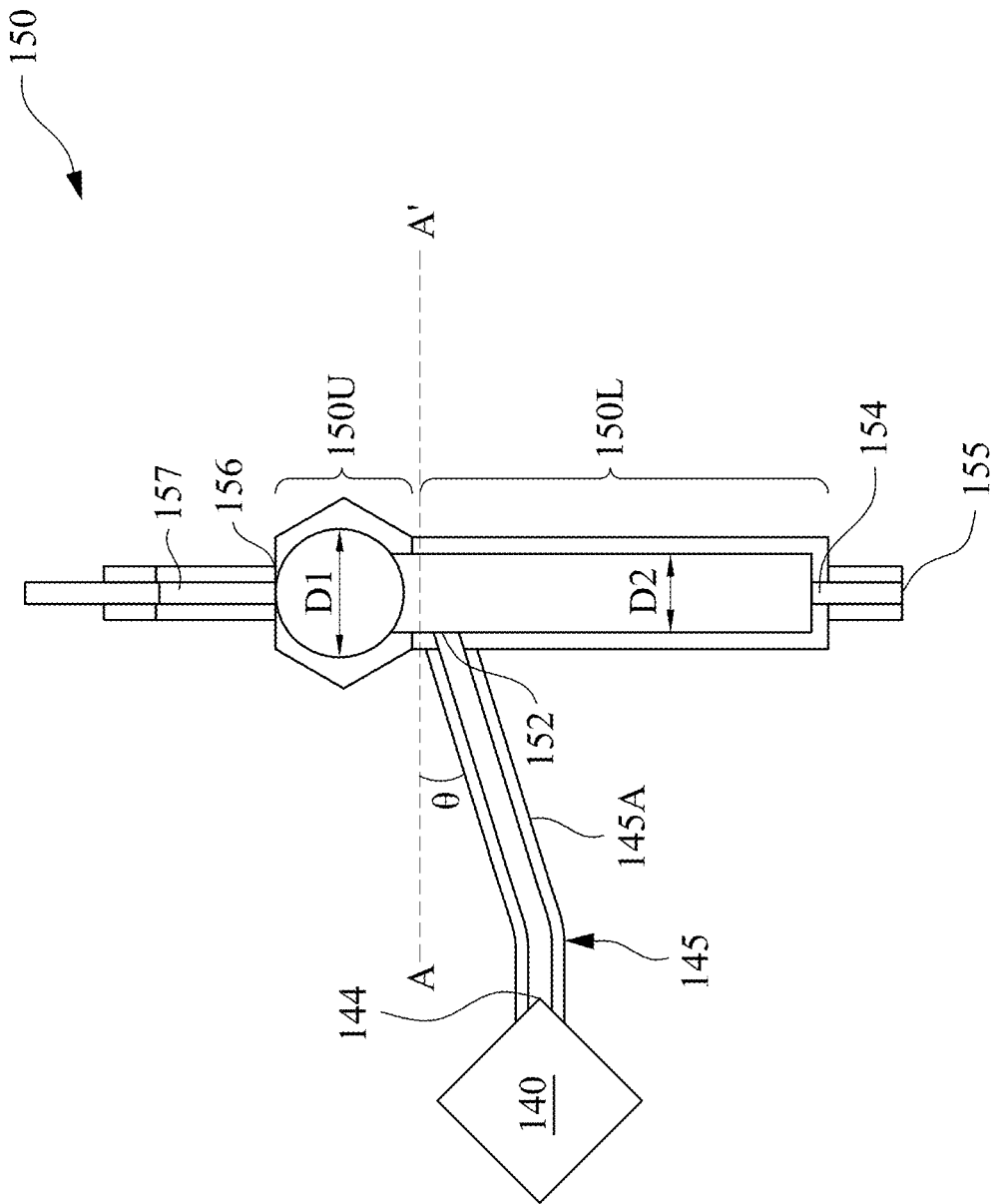
FIG. 2 is an enlarged, cross-sectional view of a mini-tank in the liquid dispensing system, in accordance with some embodiments.

FIG. 2 is an enlarged, cross-sectional view of a mini-tank 150, in accordance with some embodiments. To help effectively eliminate and/or remove the bubbles from the mini-tank 150, in some embodiments, an upper portion 150U of the mini-tank 150 above the liquid inlet 152 has a lateral dimension D1 greater than a lateral dimension D2 of a lower portion 150L. The increased volume at an upper portion 150U of the mini-tank 150 allows more bubbles to be collected in the top space of the mini-tank 150. As a result, the bubbles are easily released into the atmosphere from the top end of the mini-tank 150 via the pipe 157 and vent valve 158. In some embodiments, the interior of the upper portion 150U of the mini-tank 150 has a circular, a semi-circular, or a semi-elliptical streamlined shape in cross section. The streamlined shape helps to reduce turbulence of the flow field along the interior surface of the upper portion 150U, which helps to reduce the bubble formation as the filtered liquid flows into the mini-tank 150. In addition, in some embodiments, the pipe 145 for supplying the filtered liquid from the filter 140 to the mini-tank 150 is provided with a sloped portion 145A. An end of the sloped portion 145A of the pipe 145 is sized to mate with the liquid inlet 152 of the mini-tank 150. The sloped portion 145A of the pipe 145 is oriented at an angle ($\theta$) with respect to the horizontally-oriented axis A-A' of the mini-tank 150. In various embodiments, the angle $\theta$ is an acute angle ranging between about 1 degree and about 90 degrees. In some embodiments, the angle $\theta$ is about 20 degrees. If the angle $\theta$ is too large extra energy is used to pump liquid into the mini-tank 150 in some instances. If the angle $\theta$ is too small bubbles become trapped in the piping, in some instances. The sloped portion 145A of the pipe 145 allows the bubble-containing filtered liquid to flow through the pipe 145 and enter the liquid inlet 152 of the mini-tank 150 at an angle. The sloped portion 145A of the pipe 145 facilitates the migration of bubbles within the pipe 145 to the upper portion 150U of the mini-tank 150, and thereby helps to prevent bubbles from being trapped in the pipe 145. Increasing the angle $\theta$ helps to promote a smooth fluid distribution from the pipe 145 to the interior of the mini-tank 150. Normally, the larger angle $\theta$ makes the bubbles to move more easily into the top space of the mini-tank 150. Furthermore, in some embodiments, the lateral dimension (i.e., diameter) of the pipe 157 is increased to allow larger bubbles to escape from the mini-tank 150. In some embodiments, the pipe 157 has a diameter greater than about ⅛ inch but less than the lateral dimension of the lower portion 150L of the mini-tank 150. In some embodiments, the diameter of the pipe 157 is less than about ½ inch.

Figure 3A:
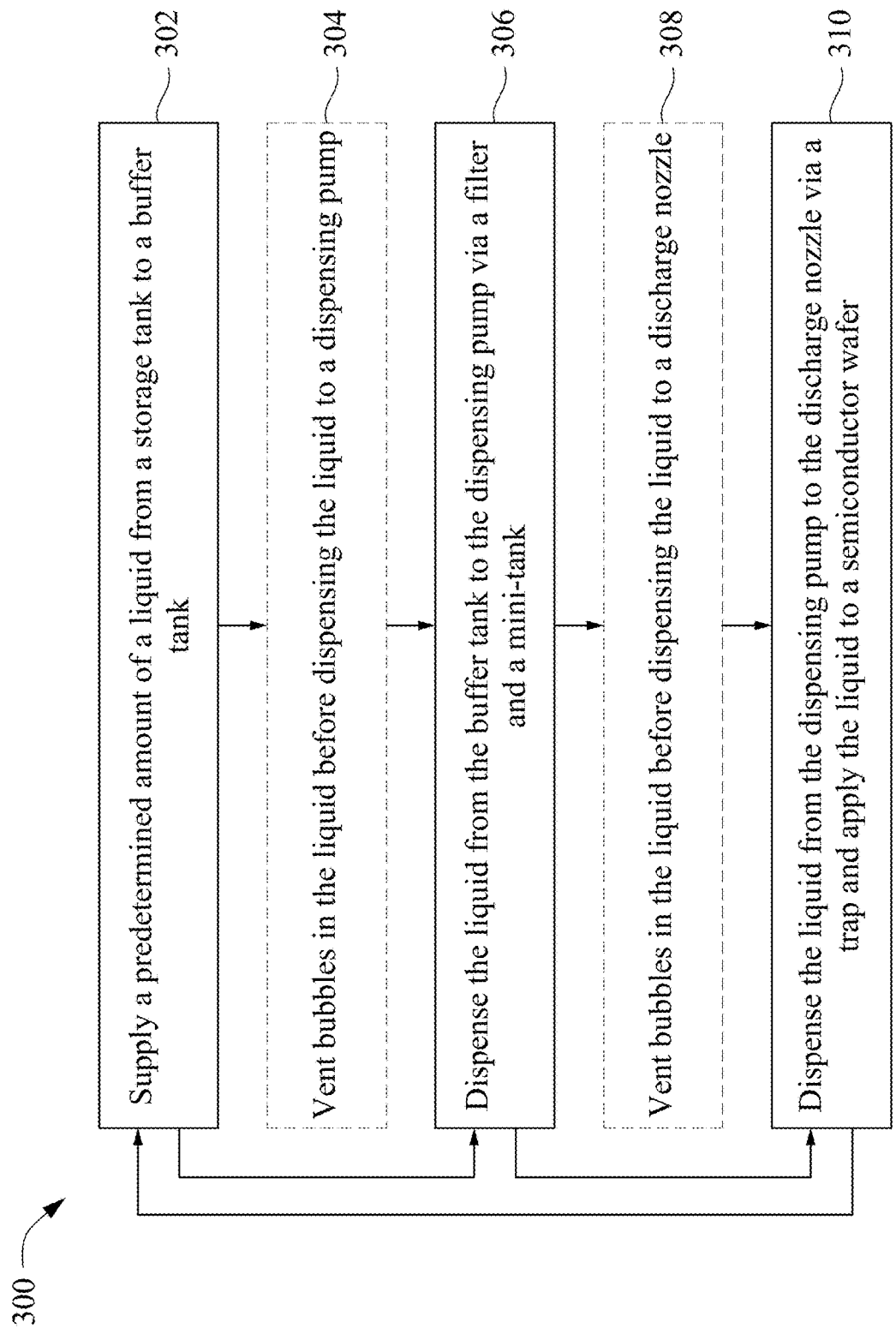
FIG. 3A is a flowchart of a method for dispensing a liquid on to a semiconductor wafer using a liquid dispensing system, in accordance with some embodiments.

FIG. 3A is a flowchart of a method 300 for dispensing a liquid 104 on to a semiconductor wafer 190 using a liquid dispensing system 100, in accordance with some embodiments. One or more components of the liquid dispensing system 100 is/are controlled by a control unit 400 (FIG. 4) to perform the method 300.

The method 300 includes operation 302 in which a predetermined amount of a liquid, e.g., liquid 104, is supplied from a storage container 102 to a buffer tank 120. In response to a control signal from the control unit 400 requesting filling of the buffer tank 120, valves 112 and 118 are opened. Gas from the pressurized gas supply 108 pressurizes the liquid 104 in the storage container 102, causing the liquid 104 in the storage container 102 to flow into the buffer tank 120. The liquid 104 is delivered from the bottom of the storage container 102 to allow bubbles in the liquid 104 to rise to the top of the storage container 102 and minimize dispensing of bubbles in the liquid 104 to the buffer tank 120. In response to receipt of a signal from a high level sensor 132 in the buffer tank 120 indicating the predetermined amount of liquid 104 has flowed into buffer tank 120, the control unit 400 sends a control signal to cause valves 112 and 118 to close so that supply of the liquid 104 from the storage container 102 to the buffer tank 120 is stopped.

In operation 304, before dispensing the liquid 104 from the buffer tank 120 to a dispensing pump 160, bubbles in the liquid 104 are vented to an atmosphere external to the liquid dispensing system 100.

In operation 306, an amount of the liquid 104 substantially free of bubbles in the buffer tank 120 is drawn by the dispensing pump 160 in response to a control signal sent from the control unit 400. In operation 306, the liquid 104 flows from the buffer tank 120 to the dispensing pump 160 via a filter 140 and a mini-tank 150.

In operation 308, before dispensing the liquid 104 from the dispensing pump 160 to a discharge nozzle 182, bubbles in the liquid 104 are vented to an atmosphere external to the liquid dispensing system 100.

In operation 310, the dispensing pump 160 dispenses the liquid 104 to the discharge nozzle 182 via a trap 170 in response to a control signal sent from the control unit 400 and the discharge nozzle 182 applies the liquid 104 to the semiconductor wafer 190. During the dispensing operation, vent valves 130, 148, 158 and 178 are closed, while a supply control valve 180 is opened in response to a control signal sent from the control unit 400. In some embodiments, the liquid is drawn from the buffer tank 120 by the dispensing pump 160 each time the discharge nozzle 182 makes an application of the liquid 104 to the semiconductor wafer 190. The opening and closing of the supply control valve 180 are controlled by the control unit 400. Operations 304-306 are repeated until a liquid level of the liquid 104 in the buffer tank 120 is sufficiently low so as to trigger a low level sensor 134. In response to the signal from the low level sensor 134 indicative of the low liquid level in the buffer tank 120, the method 300 performs operation 302 in which the control unit 400 sends a control signal to cause the valves 112 and 118 to open so that supply of the liquid 104 from the storage container 102 to the buffer tank 120 is started to refill the buffer tank 120.

Figure 3B:
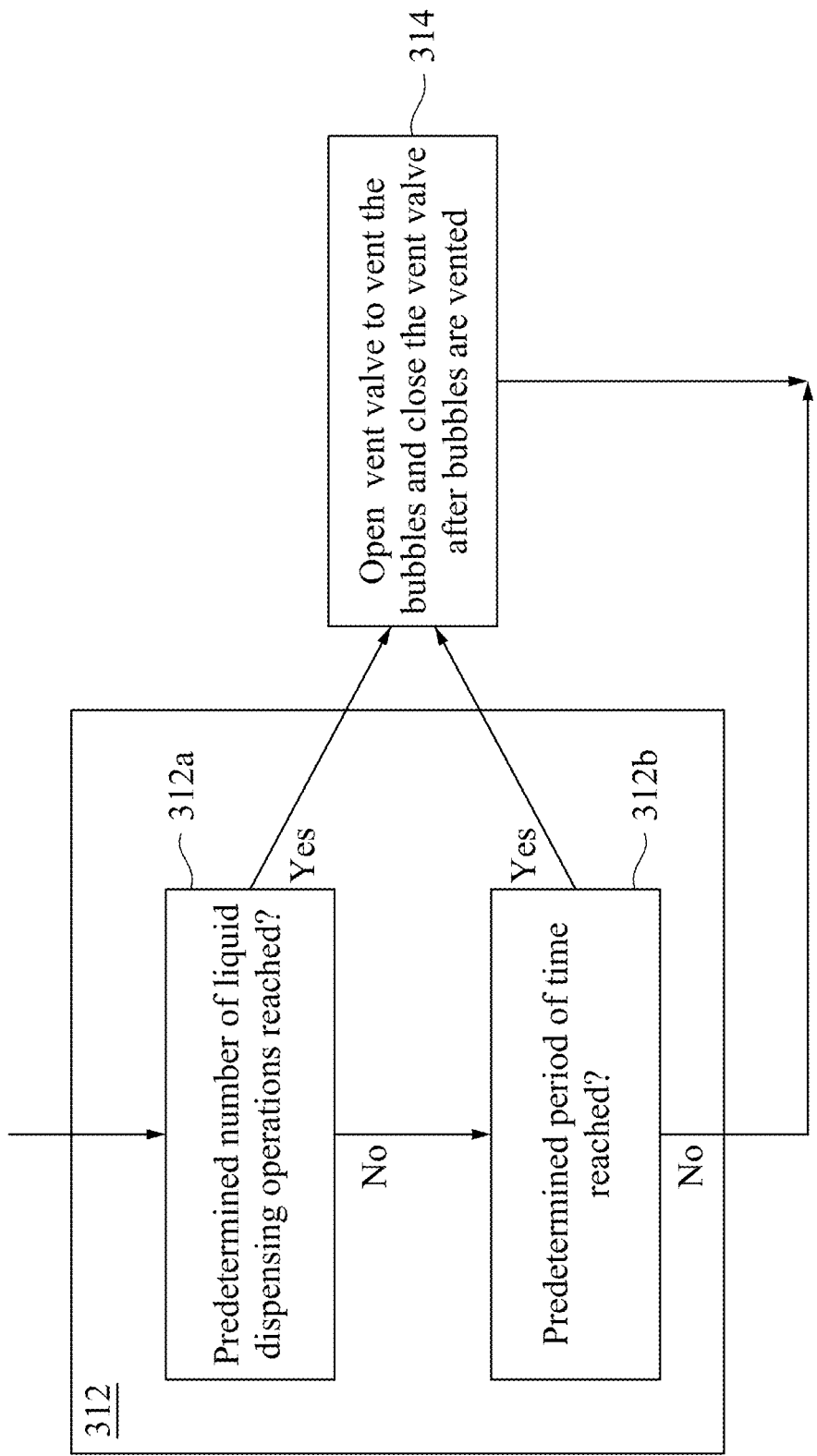
FIG. 3B is a flowchart of a venting operation, in accordance with some embodiments.

FIG. 3B is a flowchart of a venting operation 320, in accordance with some embodiments. Venting operation 320 is usable as an embodiment of operation 304 or operation 308 of FIG. 3A.

In FIG. 3B, venting operation 320 includes operations 312 and 314. In operation 312, the control unit 400 determines whether a predetermined number of liquid dispensing operations performed by the dispensing pump 160 (operation 312a) or a predetermined period of time associated with venting one or more of the buffer tank 120, the filter 140, the mini-tank 150 and the trap 170 (operation 312b) has been reached. If the predetermined number of liquid dispensing operations performed by the dispensing pump 160 or the predetermined period of time associated with one or more of buffer tank 120, filter 140, mini-tank 150, and trap 170 has been reached, the method 300 performs operation 314 (yes branch from operations 312a or 312b). In operation 314, the control unit 400 sends a control signal to cause one or more corresponding vent valves 130, 148, 158, 178 to open, venting the bubbles. After a predetermined period of time, the control unit 400 sends a control signal to cause one or more corresponding vent valves 130, 148, 158, 178 to close, ending venting operation 320. On the other hand, if the predetermined number of liquid dispensing operations performed by the dispensing pump 160 (operation 312a) or the predetermined period of time associated with any one of buffer tank 120, filter 140, mini-tank 150, and trap 170 (operation 312b) has not been reached, venting operation 320 concludes (no branch from operation 312b and transition from operation 314.

Figure 4:
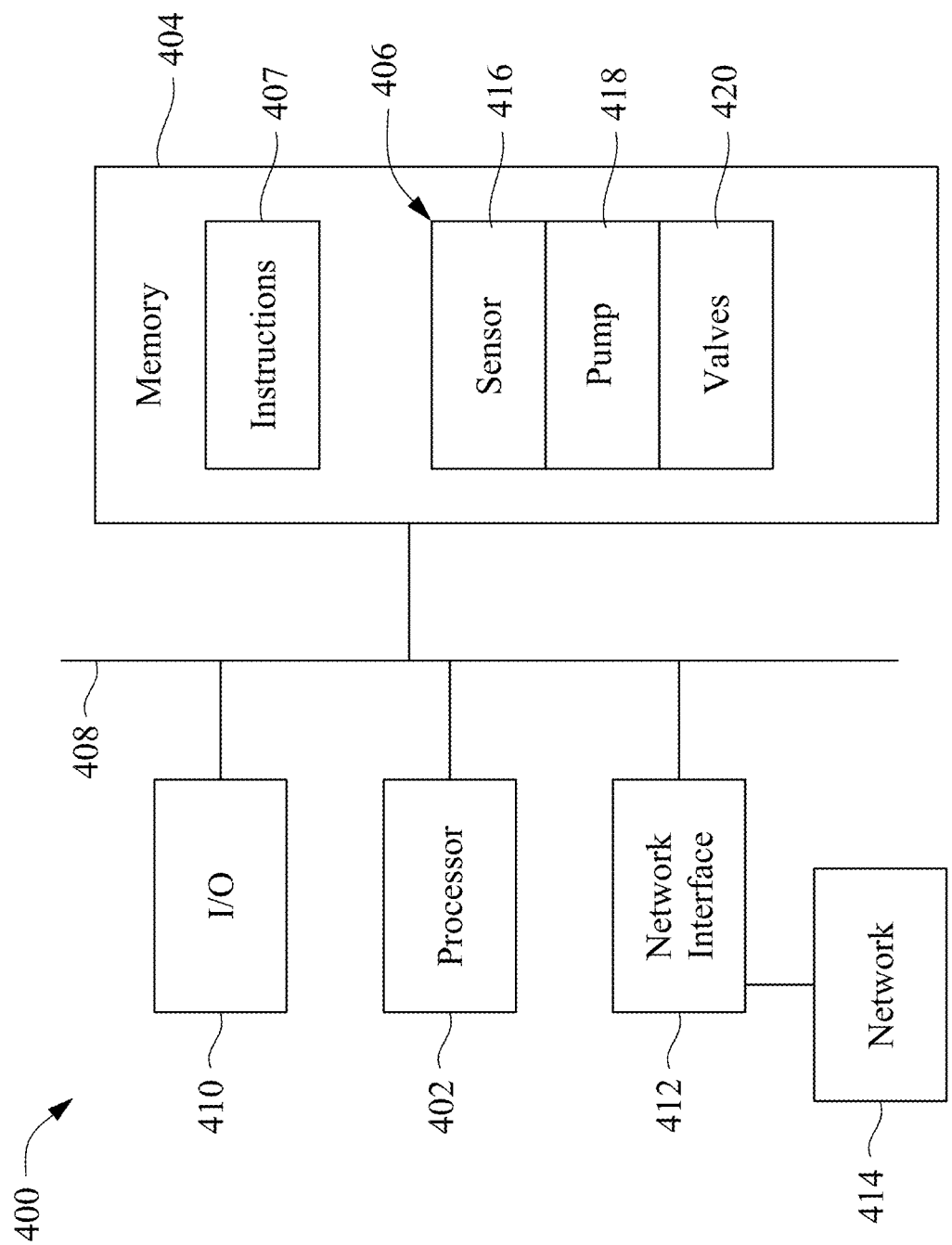
FIG. 4 is a block diagram of a control unit for controlling operations of a liquid dispensing system, in accordance with some embodiments.

FIG. 4 is a block diagram of a control unit 400 for controlling operations of a liquid dispensing system 100, in accordance with some embodiments. In some embodiments, the control unit 400 is a general purpose computing device including a hardware processor 402 and a non-transitory, computer readable storage medium 404 encoded with, i.e., storing, the computer program code 406, i.e., a set of executable instructions. The computer readable storage medium 404 is also encoded with instructions 407 for interfacing with the dispensing pump 160, valves 112, 118, 130, 148, 158, 178 and 180, and sensors 132 and 134 of the liquid dispensing system 100. The processor 402 is electrically coupled to the computer readable storage medium 404 via a bus 408. The processor 402 is also electrically coupled to an I/O interface 410 by bus 408. A network interface 412 is also electrically connected to the processor 402 via a bus 408. The network interface 412 is connected to a network 414, so that processor 402 and computer readable storage medium 404 are capable of connecting to external elements via network 414. The processor 402 is configured to execute the computer program code 406 encoded in the computer readable storage medium 404 in order to cause control unit 400 to be usable for performing the operations as described with respect to the liquid dispensing system 100.

In some embodiments, the processor 402 is a central processing unit (CPU), a multi-processor, a distributed processing system, an application specific integrated circuit (ASIC), and/or a suitable processing unit.

In some embodiments, the computer readable storage medium 404 is an electronic, magnetic, optical, electromagnetic, infrared, and/or a semiconductor system (or apparatus or device). For example, the computer readable storage medium 404 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 404 includes a compact disk-read only memory (CD-ROM), a compact disk-read/write (CD-R/W), and/or a digital video disc (DVD).

In some embodiments, the storage medium 404 stores the computer program code 406 configured to cause the control unit 400 to perform the operations as described with respect to the liquid dispensing system 100. In some embodiments, the computer readable storage medium 404 also stores information needed for performing the operations as described with respect to the liquid dispensing system 100, such as sensor parameters 416 such as the liquid levels detected by the high level and low level sensors 132 and 134 and gas pressure detected by sensor 114, pump parameters 418 such as predetermined numbers of liquid dispensing by the dispensing pump 160, and valve parameters 420 such as predetermined period of times to open and close vent valves 130, 148, 158 and 178 and/or a set of executable instructions to perform the operations as described with respect to the liquid dispensing system 100.

In some embodiments, the computer readable storage medium 404 stores instructions 407 for interfacing with the liquid dispensing system 100. The instructions 407 enable the processor 402 to generate operating instructions readable by the dispensing pump 160, valves 112, 118, 130, 148, 158, 178 and 180, and sensors 132 and 134 of the liquid dispensing system 100 to effectively implement the operations as described with respect to the liquid dispensing system 100.

The control unit 400 includes I/O interface 410. The I/O interface 410 is coupled to external circuitry. In some embodiments, the I/O interface 410 includes a keyboard, keypad, mouse, trackball, trackpad, and/or cursor direction keys for communicating information and commands to the processor 402.

The control unit 400 also includes network interface 412 coupled to the processor 402. The network interface 412 allows the control unit 400 to communicate with the network 414, to which one or more other computer systems are connected. The network interface 412 includes wireless network interfaces such as BLUETOOTH, WIFI, WIMAX, GPRS, or WCDMA; or wired network interface such as ETHERNET, USB, or IEEE-1394. In some embodiments, the operations as described with respect to the liquid dispensing system 100 are implemented in two or more control units 400, and information such as sensor, pump and valve information are exchanged between different control units 400 via network 414.

An aspect of this description relates to a method for eliminating bubbles from a liquid dispensing system. The method includes flowing a liquid containing bubbles into a liquid inlet of a tank from a filter to substantially fill the tank, wherein substantially all bubbles accumulate in an upper portion of the tank having a lateral dimension greater than a lateral dimension of a lower portion of the tank, and flowing the liquid into the tank comprises flowing the liquid through an inlet pipe extending at an acute angle relative to a horizontally-oriented axis of the tank. The method further includes flowing a liquid substantially free of bubbles out of the tank via a liquid outlet at the lower portion of the tank for dispensing to a substrate. In some embodiments, the method further includes venting the bubbles accumulated in the upper portion of the tank to an atmosphere external to the tank via a pipe coupled to a gas outlet at a top of the tank, wherein the pipe has a diameter greater than the lateral dimension of the lower portion of the tank. In some embodiments, the method further includes flowing a liquid through the filter to provide the liquid containing the bubbles.

An aspect of this description relates to a method of dispensing a liquid. The method includes filtering, using a filter, a liquid to provide a filtered liquid. The method further includes supplying the filtered liquid to a tank through a first pipe, wherein the first pipe extends at an acute angle relative to a horizontally-oriented axis of the tank. The method further includes venting bubbles from the filtered liquid from an upper portion of the tank, wherein the upper portion of the tank is above the first pipe, a width of the upper portion varies as a distance from the first pipe increases, and a width of a lower portion of the tank is constant as a distance from the first pipe increases. In some embodiments, venting the bubbles includes venting the bubbles from the upper portion having a circular, a semi-circular, or a half elliptical shape in cross-section. In some embodiments, supplying the filtered liquid to the tank includes supplying the filtered liquid through a sidewall of the tank. In some embodiments, supplying the filtered liquid includes supplying the filtered liquid through the first pipe including a first portion coupled to the filter and a second portion coupled to the tank. In some embodiments, supplying the filtered liquid includes supplying the filtered liquid through the second portion of the first pipe oriented at an angle about 20 degrees with respect to the horizontally-oriented axis of the tank. In some embodiments, venting the bubbles includes venting the bubbles into an atmosphere external to the tank. In some embodiments, venting the bubbles includes venting the bubbles through a second pipe coupled to the tank, wherein the second pipe has a diameter greater than about ⅛ inch and less than about ½ inch. In some embodiments, the method further includes removing the filtered liquid from the lower portion of the tank. In some embodiments, removing the filtered liquid includes removing the filtered liquid at a bottom of the tank. In some embodiments, removing the filtered liquid includes pumping the filtered liquid out of the tank.

An aspect of this description includes a method. The method includes filtering a liquid using a filter. The method further includes dispensing the filtered liquid using a dispensing pump. The method further includes storing the filtered liquid prior to dispensing the filtered liquid using a tank, wherein a first portion of the tank has a lateral dimension, measured at a maximum width of the first portion, greater than a lateral dimension of a second portion of the tank, measured at a maximum width of the second portion, the second portion is below the first portion, a width of the first portion varies as a distance from the second portion increases, and a width of the second portion is constant as a distance from the first portion increases. The method further includes venting bubbles from the filtered liquid in the tank to an atmosphere external to the tank. In some embodiments, venting the bubbles includes venting the bubbles from the first portion of the tank having a circular, a semi-circular, or a half-elliptical shape in cross-section. In some embodiments, venting the bubbles includes venting the bubbles through a pipe having a diameter less than the lateral dimension of the second portion of the tank. In some embodiments, venting the bubbles includes venting the bubbles through a pipe having a diameter greater than about ⅛ inch and less than about ½ inch. In some embodiments, the method further includes supplying a liquid to the filter from a buffer tank. In some embodiments, the method further includes supplying the liquid to the buffer tank from a storage container. In some embodiments, dispensing the filtered liquid includes dispensing the filtered liquid to a substrate through a discharge nozzle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for eliminating bubbles from a liquid dispensing system, comprising:
flowing a liquid containing bubbles into a liquid inlet of a tank from a filter to substantially fill the tank, wherein substantially all bubbles accumulate in an upper portion of the tank having a lateral dimension greater than a lateral dimension of a lower portion of the tank, flowing the liquid into the tank comprises flowing the liquid through an inlet pipe extending at an acute angle relative to a horizontally-oriented axis of the tank, and an entirety of the tank below the inlet pipe has a constant width as distance from the inlet pipe increases; and flowing a liquid substantially free of bubbles out of the tank via a liquid outlet at the lower portion of the tank for dispensing to a substrate.

2. The method of claim 1, further comprising venting the bubbles accumulated in the upper portion of the tank to an atmosphere external to the tank via a pipe coupled to a gas outlet at a top of the tank, wherein the pipe has a diameter greater than the lateral dimension of the lower portion of the tank.

3. The method of claim 1, further comprising flowing a liquid through the filter to provide the liquid containing the bubbles.

4. A method of dispensing a liquid comprising:
filtering, using a filter, a liquid to provide a filtered liquid;
supplying the filtered liquid to a tank through a first pipe, wherein the first pipe extends at an acute angle relative to a horizontally-oriented axis of the tank; and
venting bubbles from the filtered liquid from an upper portion of the tank, wherein the upper portion of the tank is an entirety of the tank above the first pipe, a width of the upper portion varies as a distance from the first pipe increases, and a width of a lower portion of the tank is constant as a distance from the first pipe increases.

5. The method of claim 4, wherein venting the bubbles comprises venting the bubbles from the upper portion having a circular, a semi-circular, or a half elliptical shape in cross-section.

6. The method of claim 4, wherein supplying the filtered liquid to the tank comprises supplying the filtered liquid through a sidewall of the tank.

7. The method of claim 4, wherein supplying the filtered liquid comprises supplying the filtered liquid through the first pipe comprising a first portion coupled to the filter and a second portion coupled to the tank.

8. The method of claim 7, wherein supplying the filtered liquid comprises supplying the filtered liquid through the second portion of the first pipe oriented at an angle about 20 degrees with respect to the horizontally-oriented axis of the tank.

9. The method of claim 4, wherein venting the bubbles comprises venting the bubbles into an atmosphere external to the tank.

10. The method of claim 9, wherein venting the bubbles comprises venting the bubbles through a second pipe coupled to the tank, wherein the second pipe has a diameter greater than about ⅛ inch and less than about ½ inch.

11. The method of claim 4, further comprising removing the filtered liquid from the lower portion of the tank.

12. The method of claim 11, wherein removing the filtered liquid comprises removing the filtered liquid at a bottom of the tank.

13. The method of claim 11, wherein removing the filtered liquid comprises pumping the filtered liquid out of the tank.

14. A method comprising:
filtering a liquid using a filter;
receiving the filtered liquid at a tank;
storing the filtered liquid prior to dispensing the filtered liquid using the tank, wherein a first portion of the tank has a lateral dimension, measured at a maximum width of outermost surfaces of the tank at the first portion, greater than a lateral dimension of a second portion of the tank, measured at a maximum width of outermost surfaces of the tank at the second portion, the second portion is below the first portion, a width of the first portion varies as a distance from the second portion increases, and a width of the second portion is constant as a distance from the first portion increases, the width of the first portion farthest from the second portion is less than the lateral dimension of the first portion, and the filtered liquid is received from the filter at the second portion;
venting bubbles from the filtered liquid in the tank to an atmosphere external to the tank; and
dispensing the filtered liquid from the tank using a dispensing pump.

15. The method of claim 14, wherein venting the bubbles comprises venting the bubbles from the first portion of the tank having a circular, a semi-circular, or a half-elliptical shape in cross-section.

16. The method of claim 14, wherein venting the bubbles comprises venting the bubbles through a pipe having a diameter less than the lateral dimension of the second portion of the tank.

17. The method of claim 14, wherein venting the bubbles comprises venting the bubbles through a pipe having a diameter greater than about ⅛ inch and less than about ½ inch.

18. The method of claim 14, further comprising supplying a liquid to the filter from a buffer tank.

19. The method of claim 18, further comprising supplying the liquid to the buffer tank from a storage container.

20. The method of claim 14, wherein dispensing the filtered liquid comprises dispensing the filtered liquid to a substrate through a discharge nozzle.

* * * * *